(12) United States Patent
Wu et al.

(10) Patent No.: US 9,078,300 B2
(45) Date of Patent: Jul. 7, 2015

(54) DISPLAY-DRIVING STRUCTURE AND SIGNAL TRANSMISSION METHOD THEREOF AND MANUFACTURING METHOD THEREOF

(71) Applicant: AU Optronics Corporation, Hsin-Chu (TW)

(72) Inventors: Meng-Ju Wu, Hsin-Chu (TW);
Chun-Fan Chung, Hsin-Chu (TW);
Yu-Hsi Ho, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 209 days.

(21) Appl. No.: 13/933,298

(22) Filed: Jul. 2, 2013

(65) Prior Publication Data
US 2014/0078190 A1 Mar. 20, 2014

(30) Foreign Application Priority Data
Sep. 20, 2012 (TW) .............................. 101134508 A (51) Int. Cl.
| *G09G 5/10* | (2006.01) |
| *H05B 37/00* | (2006.01) |
| *G09G 5/02* | (2006.01) |
| *H05K 3/36* | (2006.01) |
| *H05K 1/14* | (2006.01) |

(52) U.S. Cl.
CPC .................. *H05B 37/00* (2013.01); *G09G 5/02* (2013.01); *H05K 3/36* (2013.01); *Y10T 29/49128* (2015.01); *G09G 2320/0673* (2013.01); *H05K 1/147* (2013.01); *H05K 2201/10128* (2013.01)

(58) Field of Classification Search
CPC .................. G09G 2320/0276; G09G 2360/16; G09G 2320/0626
USPC ........ 345/76–83, 87–100, 204, 690; 313/343, 313/396, 498, 500, 506; 315/169.1–169.4
See application file for complete search history.

(56) References Cited

U.S. PATENT DOCUMENTS

| 7,557,779 B2 * | 7/2009 | Tanada ............................. 345/76 |
| 7,830,080 B2 * | 11/2010 | Tanada ........................... 313/500 |
| 8,217,864 B2 * | 7/2012 | Tanada ............................. 345/76 |
| 8,379,011 B2 | 2/2013 | Bae et al. |

(Continued)

FOREIGN PATENT DOCUMENTS

| CN | 101350180 | 1/2009 |
| TW | 200643846 | 12/2006 |
| TW | 200912841 | 3/2009 |

*Primary Examiner* — Kimnhung Nguyen
(74) *Attorney, Agent, or Firm* — WPAT, PC; Justin King (57) ABSTRACT

A display-driving structure for driving a display panel is disclosed. The display-driving structure includes a first circuit board, a second circuit board, a transmission wiring, a first circuit, a second circuit, first source driver circuits and second source driver circuits. The transmission wiring is connected between the first circuit board and the second circuit board. The first circuit is disposed on the first circuit board for generating a first signal. The second circuit is disposed on the second circuit board for generating a second signal. The first source driver circuits receive the first signal from the first circuit board, and further receive the second signal via the transmission wiring and the second circuit board. The second source driver circuits receive the second signal from the second circuit board, and further receive the first signal via the transmission wiring and the first circuit board.

24 Claims, 6 Drawing Sheets

(56) References Cited

U.S. PATENT DOCUMENTS

| | | | |
|---|---|---|---|
| 8,446,348 B2* | 5/2013 | Tanada | 345/76 |
| 8,723,853 B2 | 5/2014 | Bae et al. | |
| 8,749,461 B2* | 6/2014 | Tanada | 345/82 |
| 2006/0232579 A1 | 10/2006 | Chen et al. | |
| 2006/0274029 A1 | 12/2006 | Hong et al. | |
| 2007/0126721 A1* | 6/2007 | Kurokawa | 345/204 |
| 2007/0279355 A1* | 12/2007 | Hirata et al. | 345/87 |
| 2008/0204642 A1* | 8/2008 | Kobashi | 349/116 |
| 2010/0141687 A1 | 6/2010 | Han et al. | |
| 2011/0157103 A1 | 6/2011 | Chen et al. | |
| 2013/0038581 A1* | 2/2013 | Yagi | 345/204 |
| 2013/0088478 A1 | 4/2013 | Bae et al. | |

* cited by examiner

DISPLAY-DRIVING STRUCTURE AND SIGNAL TRANSMISSION METHOD THEREOF AND MANUFACTURING METHOD THEREOF

RELATED APPLICATIONS

This application claims priority to Taiwan Application Serial Number 101134508, filed Sep. 20, 2012, which is herein incorporated by reference.

BACKGROUND

1. Field of Invention

The disclosure relates to a displaying device. More particularly, the disclosure relates to a display-driving structure on a displaying device and a signal transmission method thereof.

2. Description of Related Art

In recent years, with the fast development of display technology, a digital displaying device has been popularized greatly. Currently, most of the displaying devices with a high specification on the market are developing towards a large size and a high definition. For example, a screen size may be 32 inches to 55 inches or more, while a definition also may reach 1920×1080 full high definition or higher.

Currently, in a conventional displaying device, a source driver circuit packaged in a single chip usually has a specific maximum output pin limit. For example, if a single source driver circuit can drive 320 source lines, a screen with a horizontal definition of 1280 needs four source driver circuits for driven and a screen with a horizontal definition of 1920 needs six source driver circuits for driven.

Due to the precision limit of the current line bonding and the maximum length limit of the circuit board manufacturing process, under a conventional driving structure, it is usually necessary to distribute the aforesaid multiple source driver circuits on two source driver circuit boards and additionally configure one control circuit board for providing various control signals for the two source driver circuit boards and the like. That is, the conventional practice at least needs two source driver circuit boards and one additional control circuit board to generate various display driving signals on the source side.

If the screen display size is larger, more source driver circuit boards may be needed to configure. A transmission wiring between the aforesaid multiple source driver circuit boards and the control circuit board will become more complex and it is difficult to meet the current design demand for a narrow bezel displaying device.

SUMMARY

An aspect of the disclosure provides a display-driving structure for driving a display panel. The display-driving structure includes a first circuit board, a second circuit board, a transmission wiring, at least one first circuit, at least one second circuit, a plurality of first source driver circuits and a plurality of second source driver circuits. The transmission wiring is connected between the first circuit board and the second circuit board. The first circuit is disposed on the first circuit board for generating a first signal. The second circuit is disposed on the second circuit board for generating a second signal. The first source driver circuits are coupled to the first circuit board and electrically coupled to the first circuit and the second circuit for receiving the first signal from the first circuit board, further receiving the second signal via the transmission wiring and the second circuit board and then driving the display panel according to the first signal and the second signal. The second source driver circuits are coupled to the second circuit board and electrically coupled to the first circuit and the second circuit for receiving the second signal from the second circuit board, further receiving the first signal via the transmission wiring and the first circuit board and then driving the display panel according to the first signal and the second signal.

Another aspect of the disclosure provides a signal transmission method used on a display-driving structure to drive a display panel. The display-driving structure includes a first circuit board, a second circuit board, a plurality of first source driver circuits coupled to the first circuit board, a plurality of second source driver circuits coupled to the second circuit board, a transmission wiring connected between the first circuit board and the second circuit board, a first circuit for generating a first signal and a second circuit for generating a second signal. The signal transmission method includes: transmitting the first signal to the second source driver circuits coupled to the second circuit board through the first circuit board, the transmission wiring and the second circuit board; and transmitting the second signal to the first source driver circuits coupled to the first circuit board through the second circuit board, the transmission wiring and the first circuit board.

Another aspect of the disclosure provides a displaying device including a display panel and a display-driving structure as described in the aforesaid aspects. The display panel includes a plurality of pixels and a plurality of source lines for driving the pixels. The display-driving structure as described in the aforesaid aspects is electrically coupled to the display panel for driving the pixels through the source lines.

Another aspect of the disclosure provides a method for manufacturing a displaying device as described in the aforesaid aspects. The manufacturing method includes: providing a display panel; providing a rectangle circuit board; cutting the rectangle circuit board into a first circuit board and a second circuit board; configuring a first circuit on the first circuit board; configuring a second circuit on the second circuit board; providing first source driver circuits and second source driver circuits; coupling the first source driver circuits to the first circuit board and coupling the first source driver circuits to the display panel; and coupling the second source driver circuits to the second circuit board and coupling the second source driver circuits to the display panel.

BRIEF DESCRIPTION OF THE DRAWINGS

In order to make the foregoing as well as other purposes, features, advantages and embodiments of the disclosure more apparent, the accompanying drawings are described as follows.

DETAILED DESCRIPTION

Figure 1:
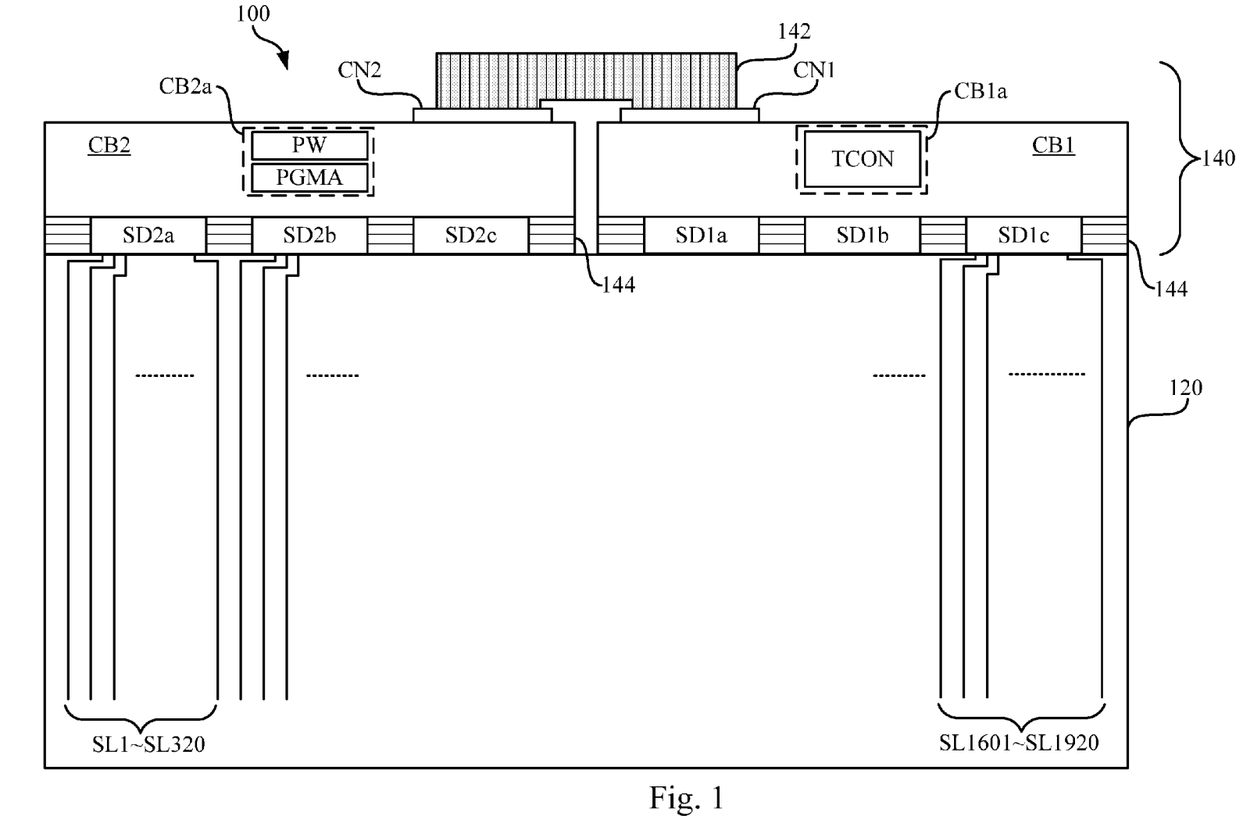
FIG. 1 illustrates a top schematic view of a displaying device and a display-driving structure used on the displaying device according to an embodiment of the disclosure.

Referring to FIG. 1, it illustrates a schematic view of a displaying device 100 and a display-driving structure 140 used on the displaying device 100 according to an embodiment of the disclosure.

As shown in FIG. 1, the displaying device 100 includes a display panel 120 and the display-driving structure 140. The displaying panel 120 includes a plurality of pixels (not shown) and a plurality of source lines (such as source lines SL1-SL1920 in FIG. 1) for driving the pixels. In the embodiment, the display panel 120 with a horizontal definition of 1920 is exemplified for description, but the disclosure is not limited to this.

The display-driving structure 140 is electrically coupled to the display panel 120 for driving each pixel on the display panel 120 through the source lines SL1-SL1920.

Nowadays, the horizontal definition of the display panel 120 is improved increasingly and the number of the horizontal source lines is increased quickly. Application examples of 1920 source lines or more source lines can be seen often. At present, a single chip package source driver circuit usually has a particular maximum output pin limit and multiple chip source driver circuits (such as SD1a-SD1c and SD2a-SD2c) are usually needed to perform the work respectively for driving the display panel 120 smoothly.

Generally, multiple source driver circuits are configured on the corresponding circuit boards of the bezel portion of the displaying device respectively. However, due to the precision limit of the current line bonding and the circuit board maximum length limit of the circuit board manufacturers, not all the source driver circuits can be configured on a single sheet of circuit board at the same time. The display-driving structure 140 of the disclosure includes at least two sheets of circuit boards (such as a first circuit board CB1 and a second circuit board CB2) each of which corresponds to multiple source driver circuits (such as the first source driver circuits SD1a-SD1c and the second source driver circuits SD2a-SD2c).

In the embodiment, the display-driving structure 140 includes the first circuit board CB1, the second circuit board CB2, a transmission wiring 142, at least one first circuit CB1a (including a time sequence control circuit TCON in the first circuit CB1a in the example of FIG. 1), at least one second circuit CB2a (including a power control circuit PW and a programmable gamma correction circuit PGMA in the second circuit CB2a in the example of FIG. 1), a plurality of first source driver circuits (including SD1a-SD1c in the example of FIG. 1) and a plurality of second source driver circuits (including SD2a-SD2c in the example of FIG. 1).

In the embodiment of FIG. 1, the first circuit board CB1 can further include a first connector CN1. The second circuit board CB2 can further include a second connector CN2. In the embodiment, the transmission wiring 142 includes or is a flexible printed circuit (FPC) or a flexible flat cable (FFC) connected to the first connector CN1 and the second connector CN2. The transmission wiring 142 is connected between the first circuit board CB1 and the second circuit board CB2.

In the display driving technology, the source driver circuits need to input various control signals (such as a time sequence control signal, a power signal and a gamma correction signal). In the conventional practice, various control circuits are configured on an additional control circuit board to provide the aforesaid control signals. In the embodiment, the display-driving structure 140 includes the first circuit CB1a and the second circuit CB2a. The first circuit CB1a is configured on the first circuit board CB1 for generating the first signal. The second circuit CB2a is configured on the second circuit board CB2 for generating the second signal.

Figure 2:
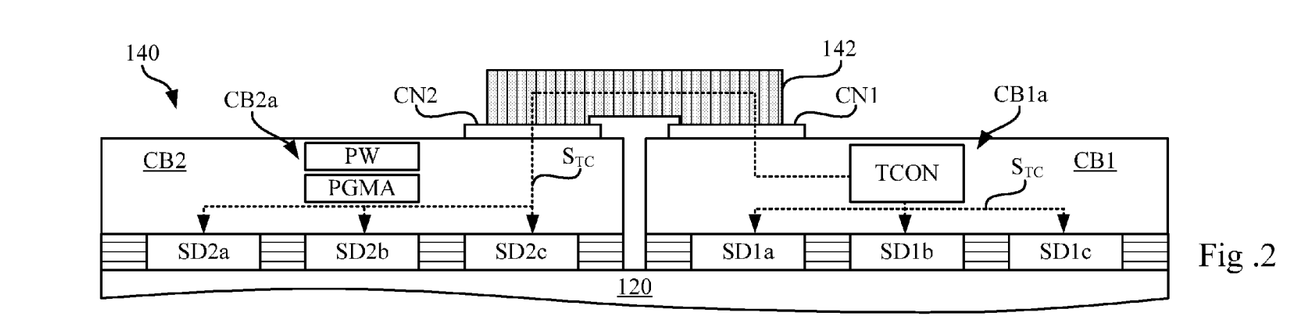
FIG. 2 illustrates a transmission schematic view of a time sequence control signal generated by a time sequence control circuit according to an embodiment of the disclosure.

Referring to FIG. 2 at the same time, it illustrates a transmission schematic view of a time sequence control signal $S_{TC}$ generated by the time sequence control circuit TCON according to an embodiment of the disclosure. In the embodiment, the first circuit CB1a includes the time sequence control circuit TCON. The first signal includes the time sequence control signal $S_{TC}$. The time sequence control circuit TCON is configured to generate the time sequence control signal $S_{TC}$ to the first/second source driver circuits SD1a-SD1c and SD2a-SD2c on the first circuit board CB1 and the second circuit board CB2. The time sequence control signal $S_{TC}$ can be, for example, a clock signal, a data signal, a digital data signal and/or an analogue data signal provided by the time sequence controller and so on.

Figure 3:
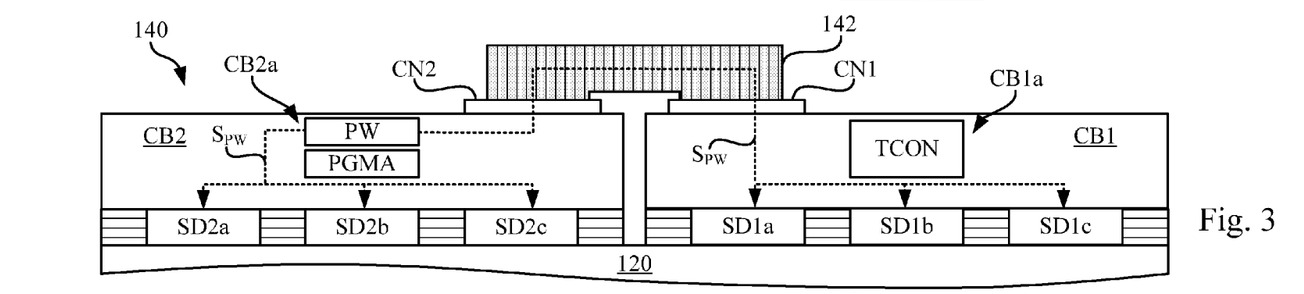
FIG. 3 illustrates a transmission schematic view of a power signal generated by a power control circuit according to an embodiment of the disclosure.
Figure 4:
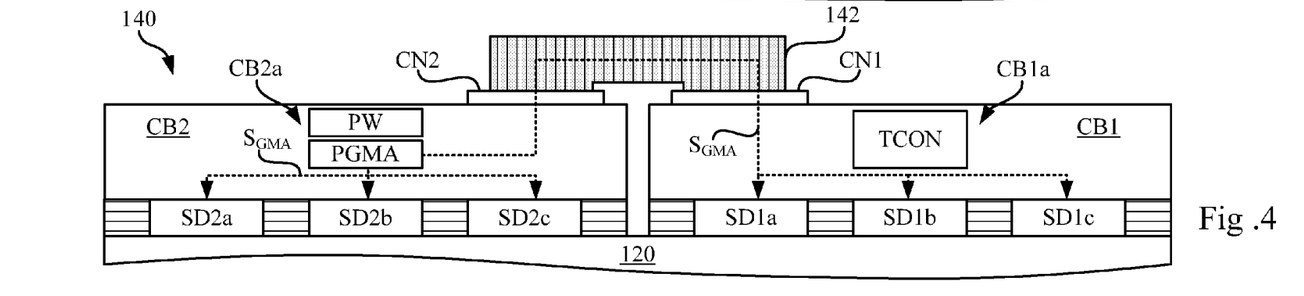
FIG. 4 illustrates a transmission schematic view of a power signal generated by a programmable gamma correction circuit according to an embodiment of the disclosure.

Referring to FIGS. 3 and 4 at the same time, FIG. 3 illustrates a transmission schematic view of a power signal $S_{PW}$ generated by the power control circuit PW according to an embodiment of the disclosure. FIG. 4 illustrates a transmission schematic view of a gamma correction signal $S_{GMA}$ generated by the programmable gamma correction circuit PGMA according to an embodiment of the disclosure. The power source signal $S_{PW}$ can be, for example, a voltage source needed by each source driver circuit at the time of operation. The gamma correction signal $S_{GMA}$ can be, for example, a reference voltage value needed by each source driver circuit to convert the received digital data signal or analogue data signal into an analogue driving voltage for driving the corresponding pixels.

In the embodiment, the second circuit CB2a includes the power control circuit PW and the programmable gamma (P-Gamma) correction circuit PGMA. The corresponding second signal includes the power signal $S_{PW}$ and the gamma correction signal $S_{GMA}$. The power control circuit PW is configured to generating the power signal $S_{PW}$ to the first/second source driver circuits SD1a-SD1c and SD2a-SD2c corresponding to the first circuit board CB1 and the second circuit board CB2.

Each of the time sequence control circuit TCON, the power control circuit PW and the programmable gamma correction circuit PGMA is packaged in an independent chip and they are configured on the first circuit board CB1 and the second circuit board CB2 averagely according to a total configuration area or a total number of lines of each of them. For example, in the embodiments of FIGS. 1-4, the configuration area of the time sequence control circuit TCON is larger and each of the power control circuit PW and the programmable gamma correction circuit PGMA has a smaller configuration area. Therefore, the waste of the area of the first circuit board CB1 and the second circuit board CB2 can be avoided.

In the embodiments of FIGS. 1-4, in order to distribute the total chip configuration area on the first circuit board CB1 and the second circuit board CB2 averagely, the first circuit CB1a includes the time sequence control circuit TCON and is configured on the first circuit board CB1. The second circuit CB2a includes the power control circuit PW and the programmable gamma correction circuit PGMA and is configured on the second circuit board CB2, but the disclosure is not limited to this.

In other embodiments, when the circuit conditions are different (such as changing the circuit chip area or the number of lines), in order to configure the total configuration area or the total number of lines on the first circuit board CB1 and the second circuit board CB2 averagely, in another embodiment, the first circuit CB1a on the first circuit board CB1 is enabled to include the time sequence control circuit TCON and the programmable gamma correction circuit PGMA and the second circuit CB2a on the second circuit board CB2 is enabled to include the power control circuit PW (not shown). Optionally, in a further embodiment, the first circuit CB1a on the first circuit board CB1 is enabled to include the time sequence control circuit TCON and the power control circuit PW and the second circuit CB2a on the second circuit board CB2 is enabled to include the programmable gamma correction circuit PGMA (not shown).

In addition, the contents of the first circuit and the second circuit are not limited to the time sequence control circuit TCON, the power control circuit PW and the programmable gamma correction circuit PGMA. In practical use, the contents of the first circuit and the second circuit can be various control chips or signal source chips necessary for the display driving and they are configured on the first circuit board CB1 and the second circuit board CB2 averagely according to the total configuration area or the total number of lines of each of them. They all fall into the scope of the disclosure.

As shown in FIGS. 2, 3 and 4, the first source driver circuits SD1a-SD1c are coupled to the first circuit board CB1 and electrically coupled to the first circuit CB1a (e.g., the time sequence control circuit TCON) and the second circuit CB2a (e.g., the power control circuit PW and the programmable gamma correction circuit PGMA) for receiving the first signal (e.g., the time sequence control signal $S_{TC}$) from the first circuit board CB1, further receiving the second signal (e.g., the power signal $S_{PW}$ and the gamma correction signal $S_{GMA}$) via the bridging of the first circuit board CB1, the transmission wiring 142 and the second circuit board CB2 and then driving the display panel 120 according to the first signal and the second signal (referring to FIG. 1). In addition, if the term connecting/coupling referred to throughout the disclosure includes a direct connecting/coupling or an indirect connecting/coupling, that is, other elements also are configured/used for the mutual couple. For example, the first/second source driver circuits SD1a-SD1c and SD2a-SD2c coupled to the corresponding circuit boards can mean that the first/second source driver circuits SD1a-SD1c and SD2a-SD2c are directly coupled to the corresponding circuit boards or the first/second source driver circuits SD1a-SD1c and SD2a-SD2c are coupled to the corresponding circuit boards through the FPC 144.

Correspondingly, as shown in FIGS. 2, 3 and 4, the second source driver circuits SD2a-SD2c are coupled to the second circuit board CB2 and electrically coupled to the first circuit CB1a (e.g., including the time sequence control circuit TCON) and the second circuit CB2a (e.g., including the power control circuit PW and the programmable gamma correction circuit PGMA) for receiving the second signal (e.g., the power signal $S_{PW}$ and the gamma correction signal $S_{GMA}$) from the second circuit board CB2, further receiving the first signal (e.g., the time sequence control signal $S_{TC}$) via the second circuit board CB2, the transmission wiring 142 and the first circuit board CB1 and then driving the display panel 120 according to the first signal and the second signal (referring to FIG. 1).

Another embodiment of the disclosure is a signal transmission method. Based on the aforesaid method and the driving circuit structure, the signal transmission method transmits the first signal through the first circuit board, the transmission wiring and the second circuit board to the second source driver circuits coupled to the second circuit board. On the other hand, the second signal is transmitted to the first source driver circuits coupled to the first circuit board through the second circuit board, the transmission wiring and the first circuit board.

Furthermore, in the aforesaid embodiments, the first source driver circuits SD1a-SD1c can be configured on the FPC 144 between the first circuit board CB1 and the display panel 120 (as shown in FIG. 1). The second source driver circuits SD2a-SD2c can be configured on the FPC 144 between the second circuit board CB2 and the display panel 120 (as shown in FIG. 1). But the disclosure is not limited to this.

In another embodiment, the first source driver circuits SD1a-SD1c also can be directly configured on (directly coupled to) the first circuit board CB1. The second source driver circuits SD2a-SD2c also can be directly configured on the second circuit board CB2 and they drive the source lines on the display panel 120 through connection lines respectively, which is well-known for those of skills in the art and will not be described anymore.

As shown in the aforesaid embodiments, between the first circuit board CB1 and the second circuit board CB2 in the display-driving structure 140, the first signal and the second signal can be exchanged bilaterally and shared.

In the aforesaid embodiments, six groups of the source driver circuits in the display-driving structure 140 are exemplified for description, but the disclosure is not limited to this. The number of the source driver circuits can be four groups, six groups, eight groups or any groups, depending on the actual need. In addition, when the horizontal definition of the display panel 120 is larger or the horizontal width of the display panel 120 is longer, the number of the source driver circuits corresponding to the display-driving structure 140 may be larger while the number of the circuit boards included by the display-driving structure 140 is also not limited to two sheets of circuit boards each of which corresponds to three groups of the source driver circuits (total six groups).

Figure 5:
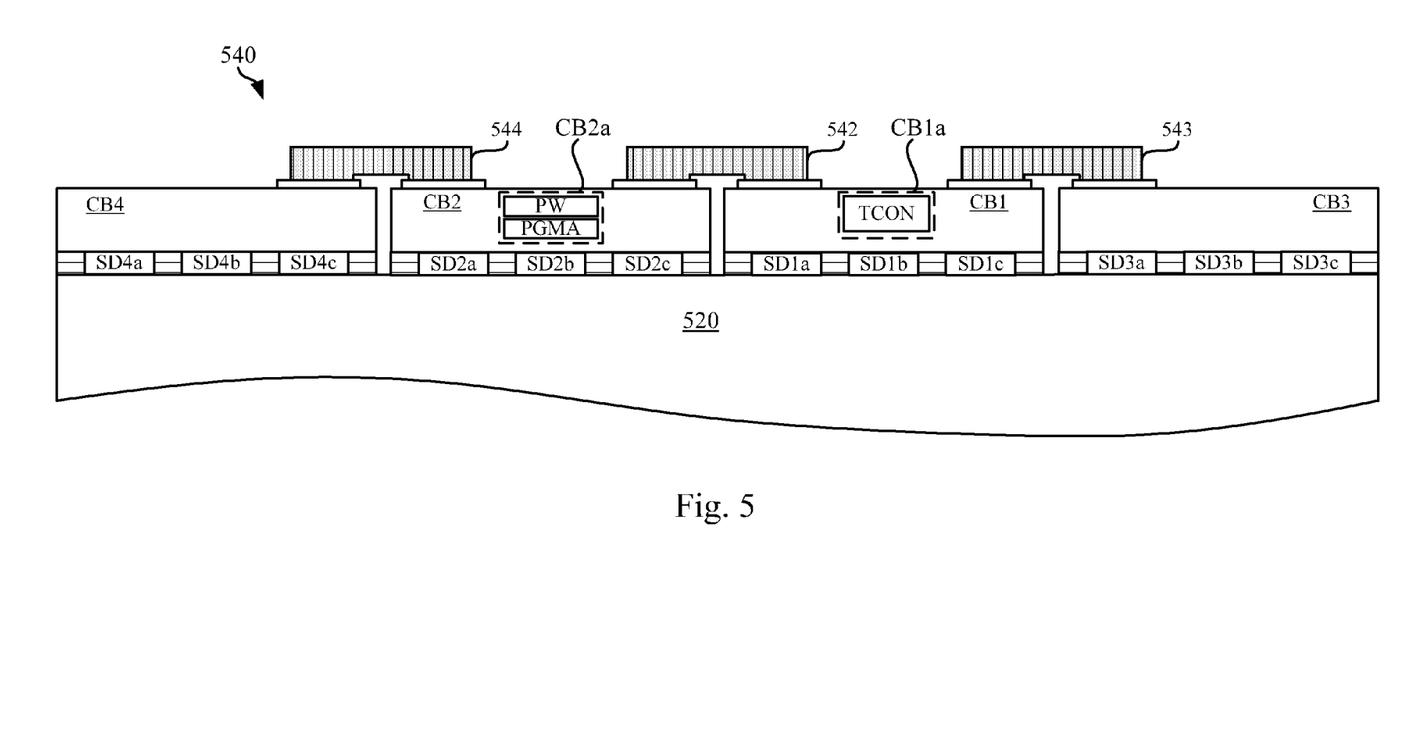
FIG. 5 illustrates a schematic view of a display-driving structure according to another embodiment of the disclosure.

Referring to FIG. 5, it illustrates a schematic view of a display-driving structure 540 according to another embodiment of the disclosure. Compared to the embodiments of FIGS. 1-4, the display-driving structure 540 further includes a third circuit board CB3, a fourth circuit board CB4, a plurality of third source driver circuits SD3a-SD3c and a plurality of fourth source driver circuits SD4a-SD4c. The third circuit board CB3 is connected to the first circuit board CB1 through a transmission wiring 543 and the fourth circuit board CB4 is connected to the second circuit board CB2 through a transmission wiring 544.

The third source driver circuits SD3a-SD3c are coupled to the third circuit board CB3 (configured on the third circuit board CB3 or the FPC between the third circuit board CB3 and the display panel) and electrically coupled to the first circuit CB1a on the first circuit board CB1 (such as the time sequence control circuit TCON) and the second circuit CB2a on the second circuit board CB2 (such as the power control circuit PW and the programmable gamma correction circuit PGMA) for receiving the first signal generated by the first circuit CB1a through the third circuit board CB3, the transmission wiring 543 and the first circuit board CB1 and further receiving the second signal generated by the second circuit CB2a through the transmission wiring 542 and the second circuit board CB2.

The fourth source driver circuits SD4a-SD4c are coupled to the fourth circuit board CB4 (configured on the fourth circuit board CB4 or the FPC between the fourth circuit board CB4 and the display panel) and electrically coupled to the first circuit CB1a on the first circuit board CB1 (such as the time sequence control circuit TCON) and the second circuit CB2a on the second circuit board CB2 (such as the power control circuit PW and the programmable gamma correction circuit PGMA) for receiving the second signal generated by the second circuit CB2a through the fourth circuit board CB4, the transmission wiring 544 and the second circuit board CB2 and further receiving the first signal generated by the first circuit CB1a through the transmission wiring 542 and the first circuit board CB1.

Figure 6A:
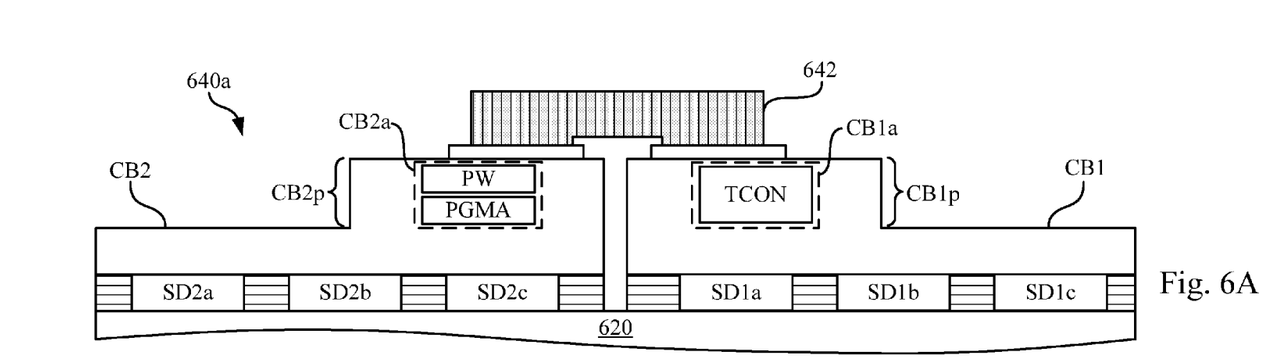
FIG. 6A illustrates a schematic view of a display-driving structure according to another embodiment of the disclosure.
Figure 6B:
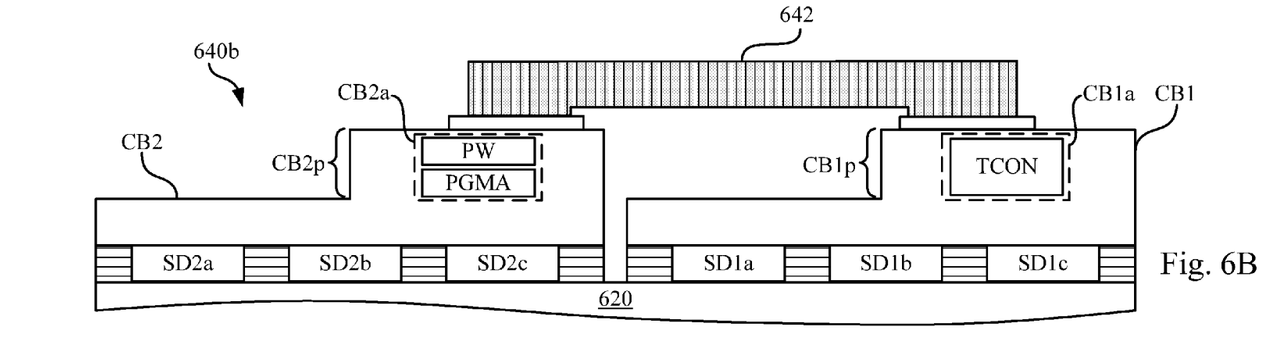
FIG. 6B illustrates a schematic view of a display-driving structure according to a further embodiment of the disclosure.
Figure 7:
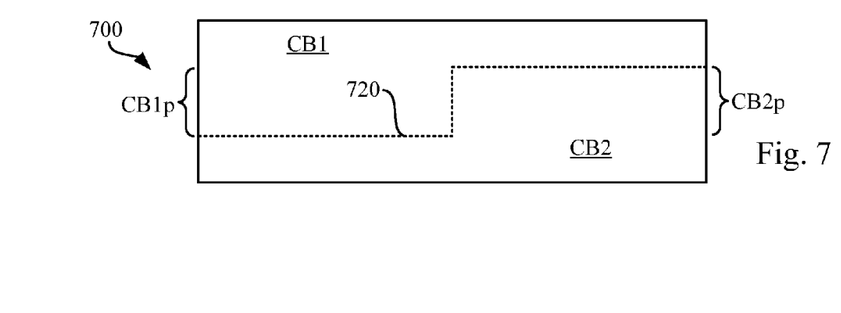
FIG. 7 illustrates a shape relationship schematic view of a first circuit board and a second circuit board according to an embodiment of the disclosure.

In the aforesaid embodiments, the rectangle is taken as an example for the first circuit board CB1 and the second circuit board CB2 in the display-driving structures 140 and 540, but the disclosure is not limited to this. In another embodiment, each of the first/second circuit boards has a protrusion portion and each of the first/second circuits is configured on the protrusion portion of each of the first/second circuit boards. Referring to FIGS. 6A, 6B and 7, FIG. 6A illustrates a schematic view of a display-driving structure 640a according to another embodiment of the disclosure. FIG. 6B illustrates a schematic view of a display-driving structure 640b according to a further embodiment of the disclosure. FIG. 7 illustrates a shape relationship schematic view of the first circuit board CB1 and the second circuit board CB2 according to an embodiment of the disclosure.

In the embodiment of FIG. 6A, each of the first circuit board CB1 and the second circuit board CB2 in the display-driving structure 640a has protrusion portions CB1p and CB2p. The first circuit CB1a (such as the time sequence control circuit TCON) is configured on the protrusion portion CB1p of the first circuit board CB1 while the second circuit CB2a (such as the power control circuit PW and the programmable gamma correction circuit PGMA) is configured on the protrusion portion CB2p of the second circuit board CB2.

In addition, in the display-driving structure 640a in the embodiment of FIG. 6A, the first circuit board CB1 having the protrusion portion CB1p and the second circuit board CB2 having the protrusion portion CB2p are complementary with each other. For example, after being turned over (e.g., turning over the other surface upwards), the first circuit board CB1 in FIG. 6A can be complementary with the second circuit board CB2 to form a rectangle, as shown in FIG. 7, and a shape of the first circuit board CB1 and a shape of the second circuit board CB2 are the same in mirror symmetry. As shown in FIG. 6A, the second circuit board CB2 can be obtained by turning over the first circuit board CB1 in a mirror direction.

On the other hand, in the display-driving structure 640b in the embodiment of FIG. 6B, the first circuit board CB1 having the protrusion portion CB1p and the second circuit board CB2 having the protrusion portion CB2p are complementary with each other. For example, after being rotated (e.g., 180 degree clockwise/counter clockwise rotation), the first circuit board CB1 in FIG. 6B can be complementary with the second circuit board CB2 to form a rectangle, as shown in FIG. 7, and the shape of the first circuit board CB1 and the shape of the second circuit board CB2 are the same. As shown in FIG. 6B, the second circuit board CB2 can be obtained by rotating the first circuit board CB1.

Another embodiment of the disclosure is a manufacturing method of a displaying device, for manufacturing the aforesaid displaying device and the driver circuit structure thereof. The manufacturing method includes: providing a display panel; providing a rectangle circuit board 710 (as shown in FIG. 7); cutting the rectangle circuit board into the first circuit board CB1 and the second circuit board CB2 approximately along a cutting line 720 (being turned over or rotated to form the configuration in FIG. 6A or FIG. 6B); configuring the first circuit on the first circuit board; configuring the second circuit on the second circuit board; then, providing the first source driver circuits SD1a-SD1c and the second source driver circuits SD2a-SD2c according to the method disclosed in the aforesaid embodiments (referring to FIG. 1 at the same time); coupling the first source driver circuits SD1a-SD1c to the first circuit board CB1 and coupling the first source driver circuits SD1-SD1c to the display panel 120; and coupling the second source driver circuits SD2a-SD2c to the second circuit board CB2 and coupling the second source driver circuits SD2a-SD2c to the display panel 120. Since the first circuit board CB1 and the second circuit board CB2 are formed by cutting the rectangle circuit board 710 (as shown in FIG. 7) approximately along the cutting line 720, the purpose of reducing material can be realized.

Figure 8:
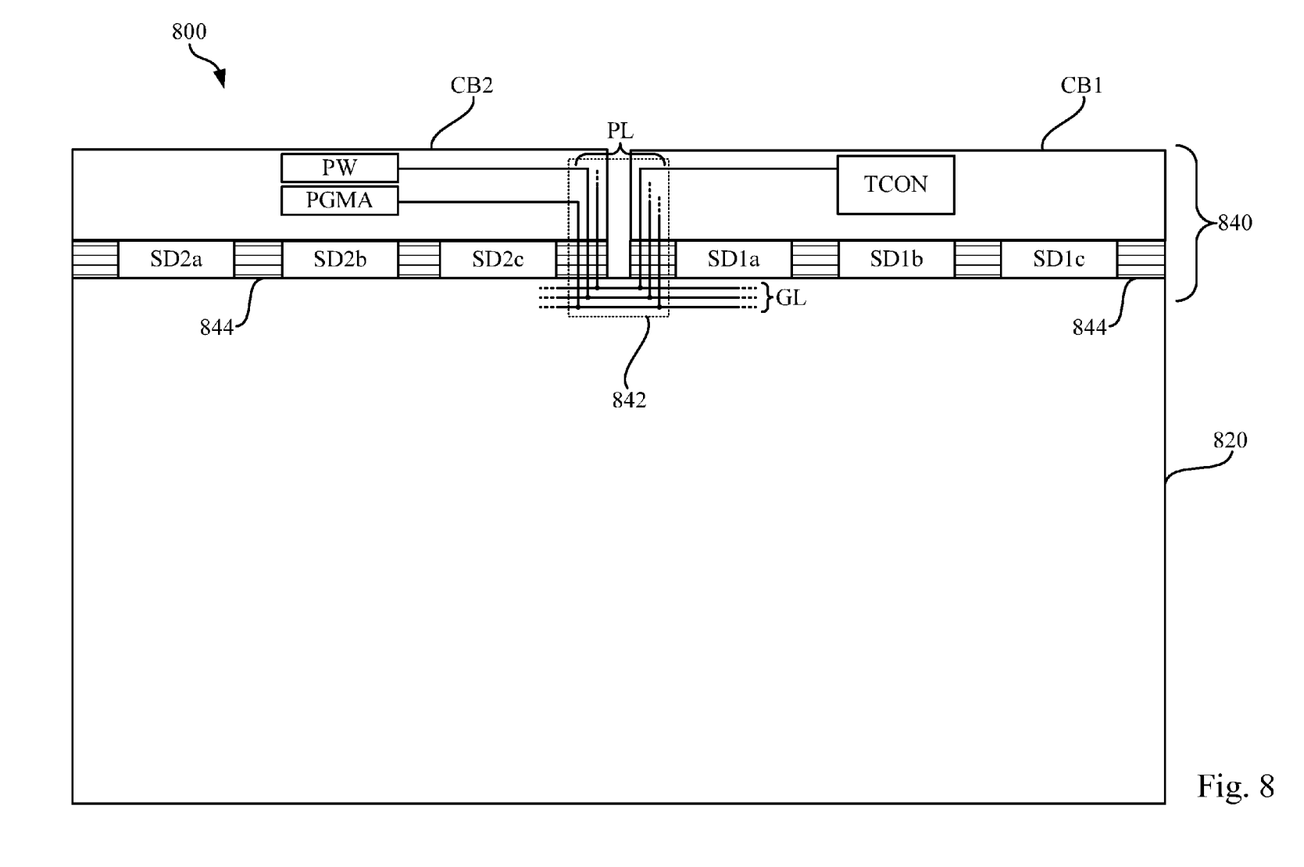
FIG. 8 illustrates a schematic view of a display-driving structure in a displaying device and a transmission wiring thereof according to another embodiment of the disclosure.

In the aforesaid embodiments, an external FPC or FFC is taken as an example for the transmission wiring between the circuit boards (as shown in FIGS. 1-6B), but the disclosure is not limited to this. In another embodiment, the transmission wiring includes pass lines integrated on the circuit boards and glass substrate lines on the display panel. Referring to FIG. 8, it illustrates a schematic view of a display-driving structure 840 in a displaying device 800 and a transmission wiring 842 thereof according to another embodiment of the disclosure.

In the embodiment as shown in FIG. 8, each of the first circuit board CB1 and the second circuit board CB2 is configured with a plurality of pass lines PL. PLs on the first circuit board CB1 and the second circuit board CB2 are coupled to a plurality of glass substrate lines GL on the display panel 820. In the embodiment of FIG. 8, the transmission wiring 842 between the first circuit board CB1 and the second circuit board CB2 includes at least one part of pass lines PL at a border between the first circuit board CB1 and the second circuit board CB2 (the left side of the first circuit board CB1 and the right side of the second circuit board CB2 in the embodiment) and the corresponding at least one part of glass substrate lines GL. In other words, in the embodiment, the transmission wiring 842 can be realized by the glass substrate lines GL and the pass lines PL. In the embodiment, the first circuit board CB1 and the second circuit board CB2 in the display-driving structure 840 and circuit elements on the circuit boards further can be packaged onto a glass substrate of the display panel 820 through the chip on film (COF) technology.

Figure 9:
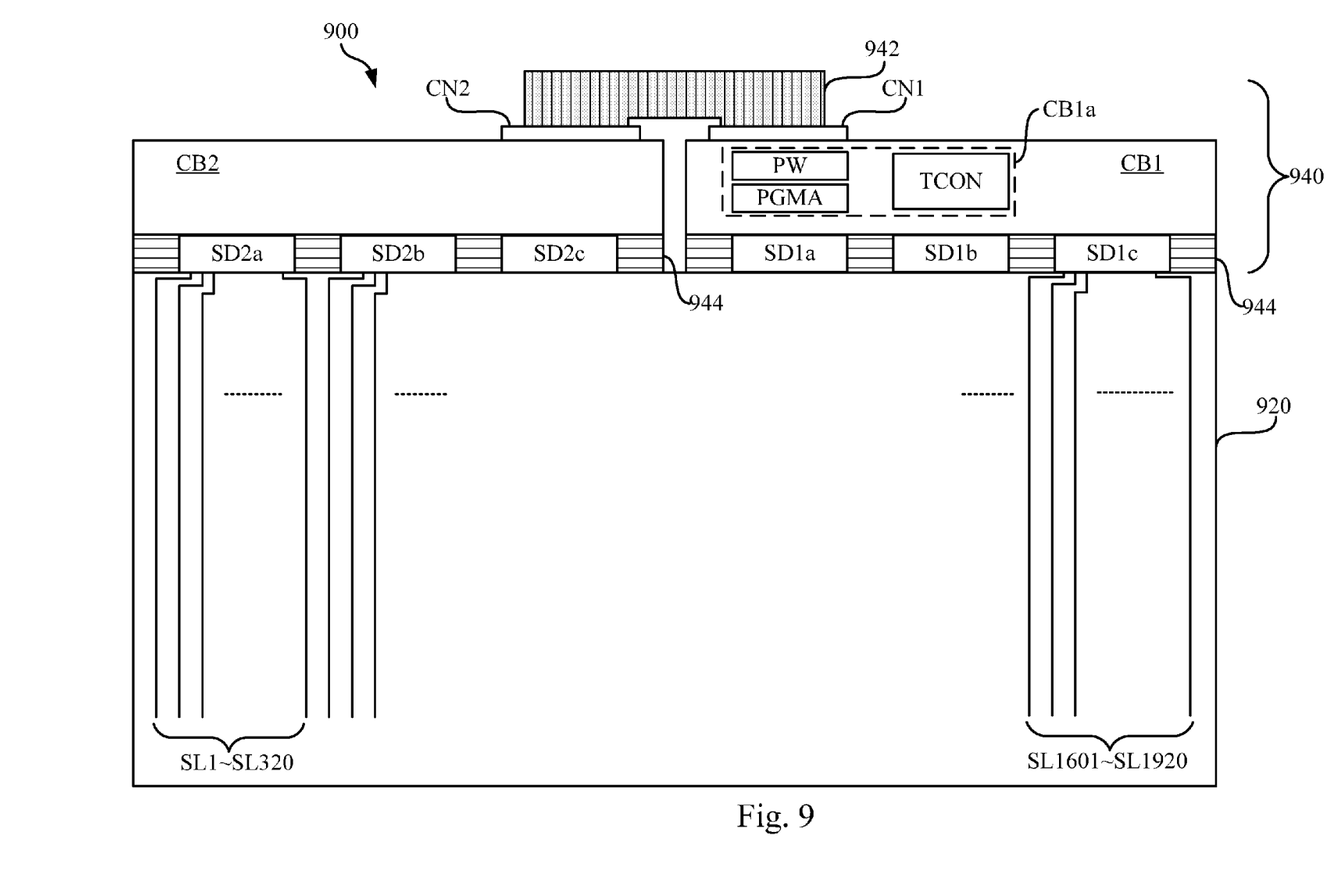
FIG. 9 illustrates a schematic view of a displaying device and a display-driving structure used on the displaying device according to an embodiment of the disclosure.

In aforesaid embodiments, there are at least one first circuit CB1a (including a time sequence control circuit TCON in the first circuit CB1a in the example of FIG. 1) disposed on the first circuit board CB1 and at least one second circuit CB2a (including a power control circuit PW and a programmable gamma correction circuit PGMA in the second circuit CB2a in the example of FIG. 1) disposed on the second circuit board CB1. However, the disclosure is not limited to this. Reference is made to FIG. 9, which illustrates a schematic view of a displaying device 900 and a display-driving structure 940 used on the displaying device 900 according to an embodiment of the disclosure.

In the embodiment, the display-driving structure 940 includes the first circuit board CB1, the second circuit board CB2, a transmission wiring 942, at least one first circuit CB1a (including a time sequence control circuit TCON, a power control circuit PW and a programmable gamma correction circuit PGMA in the example of FIG. 9), a plurality of first source driver circuits (including SD1a-SD1c in the example of FIG. 9) and a plurality of second source driver circuits (including SD2a-SD2c in the example of FIG. 9). In this case, all of the time sequence control circuit TCON, the power control circuit PW and the programmable gamma correction circuit PGMA can be disposed on one side (i.e., the first circuit board CB1), and the signals generated by these circuits TCON, PW, PGMA can be transmitted to the first source driver circuits SD1a-SD1c and also to the second source driver circuits SD2a-SD2c through the transmission wiring 942. The details of bypassing the signals generated by these circuits TCON, PW, PGMA are disclosed in aforesaid embodiments, and not to be repeated here.

In view of the above, the disclosure provides a display-driving structure and a signal transmission method thereof, and a displaying device and a manufacturing method thereof. Multiple source driver circuits in the display-driving structure provided by the disclosure are coupled to or configured on different circuit boards. Multiple circuits are configured on different circuit boards for generating the control signals required by the source driver circuits (including the power signal, the time sequence control signal, the gamma correction signal and so on). Through the transmission wiring between the circuit boards, different circuit boards corresponding to the source driver circuits are enabled to receive control signals from the circuits. The display-driving structure of the disclosure can configure the control circuits in various display applications onto multiple circuit boards averagely, without configuring any additional control circuit board.

Although the disclosure has been disclosed with reference to the above embodiments, these embodiments are not intended to limit the disclosure. Those of skills in the art can make various modifications and changes without departing from the spirit and scope of the disclosure. Therefore, the scope of the disclosure should be defined by the appended claims.

What is claimed is:

1. A display-driving structure for driving a display panel, comprising:
   a first circuit board;
   a second circuit board;
   a transmission wiring, connected between the first circuit board and the second circuit board;
   at least one first circuit, configured on the first circuit board for generating a first signal;
   to at least one second circuit, configured on the second circuit board for generating a second signal;
   a plurality of first source driver circuits, coupled to the first circuit board and electrically coupled to the first circuit board; and
   a plurality of second source driver circuits, coupled to the second circuit board and electrically coupled to the first circuit and the second circuit for receiving the second signal from the second circuit board, further receiving the first signal via the transmission wiring and the first circuit board and then driving the display panel according to the first signal and the second signal.

2. The display-driving structure of claim 1, wherein the second circuit configured to receive the first signal from the first circuit board, further receiving the second signal via the transmission wiring and the second circuit board and then driving the display panel according to the first signal and the second signal.

3. The display-driving structure of claim 2, wherein the at least one first circuit comprises a time sequence control circuit, the first signal comprises a time sequence control signal, the time sequence control circuit is configured to generate the time sequence control signal to the source driver circuits corresponding to the first circuit board and the second circuit board;
   the at least one second circuit comprises a power control circuit, the second signal comprises a power signal, and the power control circuit is configured to generate the power signal to the first or second source driver circuits on the first circuit board and the second circuit board;
   the at least one first circuit or the at least one second circuit comprises a programmable gamma correction circuit configured to generate a gamma correction signal comprised by the first signal or the second signal to the first or second source driver circuits corresponding to the first circuit board and the second circuit board.

4. The display-driving structure of claim 3, wherein each of the time sequence control circuit, the power control circuit and the programmable gamma correction circuit is packaged in an independent chip.

5. The display-driving structure of claim 3, wherein each of the first circuit board and the second circuit board has a protrusion portion, the first circuit board having the protrusion portion and the second circuit board having the protrusion portion are complementary with each other, and a shape of the first circuit board and a shape of the second circuit board are the same.

6. The display-driving structure of claim 5, wherein the at least one first circuit is configured on the protrusion portion of the first circuit board and the at least one second circuit is configured on the protrusion portion of the second circuit board.

7. The display-driving structure of claim 3, further comprising:
   a third circuit board, connected to the first circuit board;
   a fourth circuit board, connected to the second circuit board;
   a plurality of third source driver circuits, coupled to the third circuit board and electrically coupled to the first circuit and the second circuit for receiving the first signal through the third circuit board and the first circuit board and further receiving the second signal via the transmission wiring and the second circuit board;
   a plurality of fourth source driver circuits, coupled to the fourth circuit board and electrically coupled to the first circuit and the second circuit for receiving the second signal through the fourth circuit board and the second circuit board and further receiving the first signal via the transmission wiring and the first circuit board.

8. The display-driving structure of claim 2, wherein the at least one first circuit comprises a time sequence control circuit, the first signal comprises a time sequence control signal, and the time sequence control circuit is configured to generate the time sequence control signal to the source driver circuits corresponding to the first circuit board and the second circuit board;
   the at least one second circuit comprises a programmable gamma correction circuit, the second signal comprises a gamma correction signal, and the programmable gamma correction circuit is configured to generate the gamma correction signal to the first or second source driver circuits on the first circuit board and the second circuit board;

the at least one first circuit or the at least one second circuit comprises a power control circuit configured to generate a power signal comprised by the first signal or the second signal to the first or second source driver circuits corresponding to the first circuit board and the second circuit board.

9. The display-driving structure of claim 8, wherein each of the first circuit board and the second circuit board has a protrusion portion, the first circuit board having the protrusion portion and the second circuit board having the protrusion portion are complementary with each other, and a shape of the first circuit board and a shape of the second circuit board are the same.

10. The display-driving structure of claim 9, wherein the at least one first circuit is configured on the protrusion portion of the first circuit board and the at least one second circuit is configured on the protrusion portion of the second circuit board.

11. The display-driving structure of claim 8, further comprising:
a third circuit board, connected to the first circuit board;
a fourth circuit board, connected to the second circuit board;
a plurality of third source driver circuits, coupled to the third circuit board and electrically coupled to the first circuit and the second circuit for receiving the first signal through the third circuit board and the first circuit board and further receiving the second signal via the transmission wiring and the second circuit board;
a plurality of fourth source driver circuits, coupled to the fourth circuit board and electrically coupled to the first circuit and the second circuit for receiving the second signal through the fourth circuit board and the second circuit board and further receiving the first signal via the transmission wiring and the first circuit board.

12. The display-driving structure of claim 8, wherein each of the time sequence control circuit, the power control circuit and the programmable gamma correction circuit is packaged in an independent chip.

13. The display-driving structure of claim 2, wherein the at least one first circuit and the at least one second circuit are configured on the first circuit board and the second circuit board averagely according to a total configuration area or a total number of lines of each of them.

14. The display-driving structure of claim 13, wherein each of the first circuit board and the second circuit board has a protrusion portion, the first circuit board having the protrusion portion and the second circuit board having the protrusion portion are complementary with each other, and a shape of the first circuit board and a shape of the second circuit board are the same.

15. The display-driving structure of claim 14, wherein the at least one first circuit is configured on the protrusion portion of the first circuit board and the at least one second circuit is configured on the protrusion portion of the second circuit board.

16. The display-driving structure of claim 13, further comprising:
a third circuit board, connected to the first circuit board;
a fourth circuit board, connected to the second circuit board;
a plurality of third source driver circuits, coupled to the third circuit board and electrically coupled to the first circuit and the second circuit for receiving the first signal through the third circuit board and the first circuit board and further receiving the second signal via the transmission wiring and the second circuit board;
a plurality of fourth source driver circuits, coupled to the fourth circuit board and electrically coupled to the first circuit and the second circuit for receiving the second signal through the fourth circuit board and the second circuit board and further receiving the first signal via the transmission wiring and the first circuit board.

17. The display-driving structure of claim 2, wherein each of the first circuit board and the second circuit board respectively has a protrusion portion, the first circuit board having the protrusion portion and the second circuit board having the protrusion portion are complementary with each other, and a shape of the first circuit board and a shape of the second circuit board are the same.

18. The display-driving structure of claim 17, wherein the at least one first circuit is configured on the protrusion portion of the first circuit board and the at least one second circuit is configured on the protrusion portion of the second circuit board.

19. The display-driving structure of claim 2, wherein the first circuit board comprises a first connector, the second circuit board comprises a second connector, and the transmission wiring comprises a flexible printed circuit or a flexible flat cable connected to the first connector and the second connector.

20. The display-driving structure of claim 2, wherein each of the first circuit board and the second circuit board is configured with a plurality of pass lines coupled to a plurality of glass substrate lines on the display panel respectively, and the transmission wiring comprises at least one part of pass lines at a border between the first circuit board and the second circuit board and the corresponding at least one part of glass substrate lines.

21. The display-driving structure of claim 2, further comprising:
a third circuit board, connected to the first circuit board;
a fourth circuit board, connected to the second circuit board;
a plurality of third source driver circuits, coupled to the third circuit board and electrically coupled to the first circuit and the second circuit for receiving the first signal through the third circuit board and the first circuit board and further receiving the second signal via the transmission wiring and the second circuit board;
a plurality of fourth source driver circuits, coupled to the fourth circuit board and electrically coupled to the first circuit and the second circuit for receiving the second signal through the fourth circuit board and the second circuit board and further receiving the first signal via the transmission wiring and the first circuit board.

22. A signal transmission method, used on a display-driving structure to drive a display panel, wherein the display-driving structure comprises a first circuit board, a second circuit board, a plurality of first source driver circuits coupled to the first circuit board, a plurality of second source driver circuits coupled to the second circuit board, a transmission wiring connected between the first circuit board and the second circuit board and at least one first circuit configured to generate a first signal, wherein the signal transmission method comprises:
transmitting the first signal to the second source driver circuits coupled to the second circuit board through the first circuit board, the transmission wiring and the second circuit board.

23. The signal transmission method of claim 22, wherein the display-driving structure further comprises at least one second circuit configured to generate a second signal, the signal transmission method further comprises transmitting the second signal to the first source driver circuits coupled to the first circuit board through the second circuit board, the transmission wiring and the first circuit board.

24. A manufacturing method for manufacturing the display-driving structure of claim 1, comprising:
- providing a display panel;
- providing a rectangle circuit board;
- cutting the rectangle circuit board into a first circuit board and a second circuit board;
- configuring the first circuit on the first circuit board;
- configuring the second circuit on the second circuit board;
- providing first source driver circuits and second source driver circuits;
- coupling the first source driver circuits to the first circuit board and coupling the first source driver circuits to the display panel; and
- coupling the second source driver circuits to the second circuit board and coupling the second source driver circuits to the display panel.

* * * * *